(12) United States Patent
Lee et al.

(10) Patent No.: US 11,539,026 B2
(45) Date of Patent: Dec. 27, 2022

(54) DISPLAY DEVICE AND METHOD OF FABRICATING THE SAME

(71) Applicant: Samsung Display Co., LTD., Yongin-si (KR)

(72) Inventors: Sun Hee Lee, Hwaseong-si (KR); Sunho Kim, Seongnam-si (KR); Hyun Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 177 days.

(21) Appl. No.: 16/871,046

(22) Filed: May 11, 2020

(65) Prior Publication Data

US 2020/0381661 A1 Dec. 3, 2020

(30) Foreign Application Priority Data

May 31, 2019 (KR) .................. 10-2019-0064854

(51) Int. Cl.
| | | |
|---|---|---|
| *H01L 27/32* | (2006.01) | |
| *H05K 1/11* | (2006.01) | |
| *H01L 51/52* | (2006.01) | |
| *H05K 1/02* | (2006.01) | |
| *H01L 51/56* | (2006.01) | |

(52) U.S. Cl.
CPC ...... *H01L 51/5253* (2013.01); *H01L 51/5246* (2013.01); *H01L 51/56* (2013.01); *H05K 1/028* (2013.01); *H05K 2201/10128* (2013.01)

(58) Field of Classification Search
CPC ...... H05K 1/116; H05K 1/028; H05K 1/0281; H05K 1/147; H05K 2201/0128; H05K 3/361; G09F 9/301; G09F 9/33; G09F 9/30; H01L 51/5246; H01L 27/3244
See application file for complete search history.

(56) References Cited

U.S. PATENT DOCUMENTS

| | | | |
|---|---|---|---|
| 9,430,180 B2 | 8/2016 | Hirakata et al. | |
| 10,177,327 B2 | 1/2019 | Jung et al. | |
| 2011/0193217 A1* | 8/2011 | Meyer-Berg | ........ H01L 23/3121 257/734 |
| 2015/0277008 A1* | 10/2015 | Huh | .................... B32B 38/0036 428/212 |
| 2018/0026088 A1 | 1/2018 | Oh et al. | |

(Continued)

FOREIGN PATENT DOCUMENTS

| | | |
|---|---|---|
| KR | 1020180010370 A | 1/2018 |
| KR | 1020180029739 A | 3/2018 |

(Continued)

*Primary Examiner* — Caridad Everhart
(74) *Attorney, Agent, or Firm* — Cantor Colburn LLP

(57) ABSTRACT

A display device includes a display panel, a first protective member, and a second protective member. The display panel includes a front part, a first side part extending from the front part, and a pad portion extending from the first side part. A pad is on the pad portion, the first side part is bent, and each of the front part and the first side part displays an image. The first protective member is below the display panel and overlaps the front part and the first side part. The second protective member is below the display panel, in a same layer as the first protective layer, and overlaps the pad portion. The second protective member has a bending stiffness greater than a bending stiffness of the first protective member.

20 Claims, 10 Drawing Sheets

(56) References Cited

U.S. PATENT DOCUMENTS

2018/0315809 A1 11/2018 Kim et al.
2019/0237008 A1* 8/2019 Ho ..................... H01L 27/3269

FOREIGN PATENT DOCUMENTS

| KR | 1020180120310 A | 11/2018 | | |
| KR | 1020190012741 A | 2/2019 | | |
| WO | WO-2018057652 A1 * | 3/2018 | ........... | G06F 1/1643 |

* cited by examiner

DISPLAY DEVICE AND METHOD OF FABRICATING THE SAME

This application claims priority to Korean Patent Application No. 10-2019-0064854, filed on May 31, 2019, and all the benefits accruing therefrom under 35 U.S.C. § 119, the content of which in its entirety is herein incorporated by reference.

BACKGROUND

1. Field

Embodiments of the invention relate to a display device and a method of fabricating the display device, and more particularly, to a display device capable of displaying images on a plurality of display surfaces and a method of fabricating the display device.

2. Description of the Related Art

Various display devices has been widely used for multimedia apparatuses such as televisions, mobile phones, navigation systems, computer monitors, and game consoles.

According to recent market demand, research is being conducted to reduce non-display areas where no image is displayed on the display device. In addition, an attempt is being made to enlarge display areas through which users recognize an image on the display device.

SUMMARY

In a display device, an image may be displayed not only on a front surface thereof but also on a lateral surface thereof. In such a display device, when the display device is bent to form the lateral surface, cracks may occur in components therein due to concentration of stress on a bent region.

An embodiment of the invention provide a display device including a display panel capable of reducing bending-induced stress and a method of fabricating the display panel.

An embodiment of the invention provide a display device in which bonding defects between a printed circuit board and pads of a display panel are reduced, and a method of fabricating the display device.

According to an embodiment of the invention, a display device includes: a display panel including a front part, a first side part extending from the front part, and a pad portion extending from the first side part, where a pad is on the pad portion, the first side part is bent, and each of the front part and the first side part displays an image; a first protective member below the display panel and overlapping the front part and the first side part; and a second protective member below the display panel and in direct contact with the display panel, where the second protective member overlaps the pad portion. In such an embodiment, the first protective member includes: a first protective film; and a first adhesive layer between the display panel and the first protective film.

In an exemplary embodiment, the first protective member and the second protective member may be spaced apart from each other.

In an exemplary embodiment, the first protective member and the second protective member may include different materials from each other.

In an exemplary embodiment, the second protective member may be disposed is a same layer as the first protective member.

In an exemplary embodiment, the second protective member may include a radical polymerization type pressure sensitive additive ("PSA") or a cationic polymerization type PSA. In such an embodiment, the radical polymerization type PSA or the cationic polymerization type PSA may include an oligomer, a monomer, a photopolymerization initiator, and an additive.

In an exemplary embodiment, the first protective member may not overlap the pad.

In an exemplary embodiment, the second protective member may have a bending stiffness greater than a bending stiffness of the first protective member.

In an exemplary embodiment, the first adhesive layer may have a modulus in a range from about 20 kilopascal (kPa) to about 45 kPa.

In an exemplary embodiment, the display device may further include: a second protective film on the second protective member; and a second adhesive layer between the second protective member and the second protective film.

In an exemplary embodiment, the second protective film may include a material substantially the same as a material of the first protective film. The second adhesive layer may include a material substantially the same as a material of the first adhesive layer.

In an exemplary embodiment, the front part may in a substantially rectangular shape when viewed in a plan view. In such an embodiment, the first side part may extend from a first side of the front part. In such an embodiment, the display panel may further include second, third and fourth side parts which respectively extend from second, third and fourth sides of the front part, and the first to fourth sides are bent.

In an exemplary embodiment, the display device may further include a flexible printed circuit board attached to the pad.

In an exemplary embodiment, the display device may further include a bracket which is below the display panel and supports the display panel.

In an exemplary embodiment, the display device may further include a window member on the display panel and covering the front part and the first side part.

According to an embodiment of the invention, a display device includes: a display panel including a front part, a first side part extending from the front part, and a pad portion extending from a first side part, where a pad is on the pad portion, the first side part is bent, and each of the front part and the first side part displays an image; a first adhesive layer in contact with a rear surface of the front part and a rear surface of the first side part; a first protective film attached to the first adhesive layer; and a second protective member in contact with a rear surface of the pad portion. In such an embodiment, the second protective member has a modulus greater than a modulus of the first adhesive layer.

In an exemplary embodiment, the first adhesive layer and the first protective film may not overlap the pad.

In an exemplary embodiment, the first adhesive layer may have a modulus in a range from about 20 kPa to about 45 kPa.

According to an embodiment of the invention, a method of fabricating a display device includes: preparing a display panel that includes a front part, a side part extending from the front part, and a pad portion extending from the side part, where a pad is provided on the pad portion, and each of the front part and the side part displays an image; providing a first protective member on the front part and the side part; providing on the pad portion a second protective member having a bending is greater than a bending stiffness of the first protective member; and compressively bonding the pad and a printed circuit board to each other.

In an exemplary embodiment, the providing the second protective member may include: coating a curable material on a rear surface of the display panel; and curing the curable material.

In an exemplary embodiment, the providing the second protective member may be performed before the providing the first protective member.

BRIEF DESCRIPTION OF THE DRAWINGS

The above and other features of the invention will become more apparent by describing in more detail embodiments thereof with reference to the accompanying drawings, in which.

DETAILED DESCRIPTION

Figure 1:
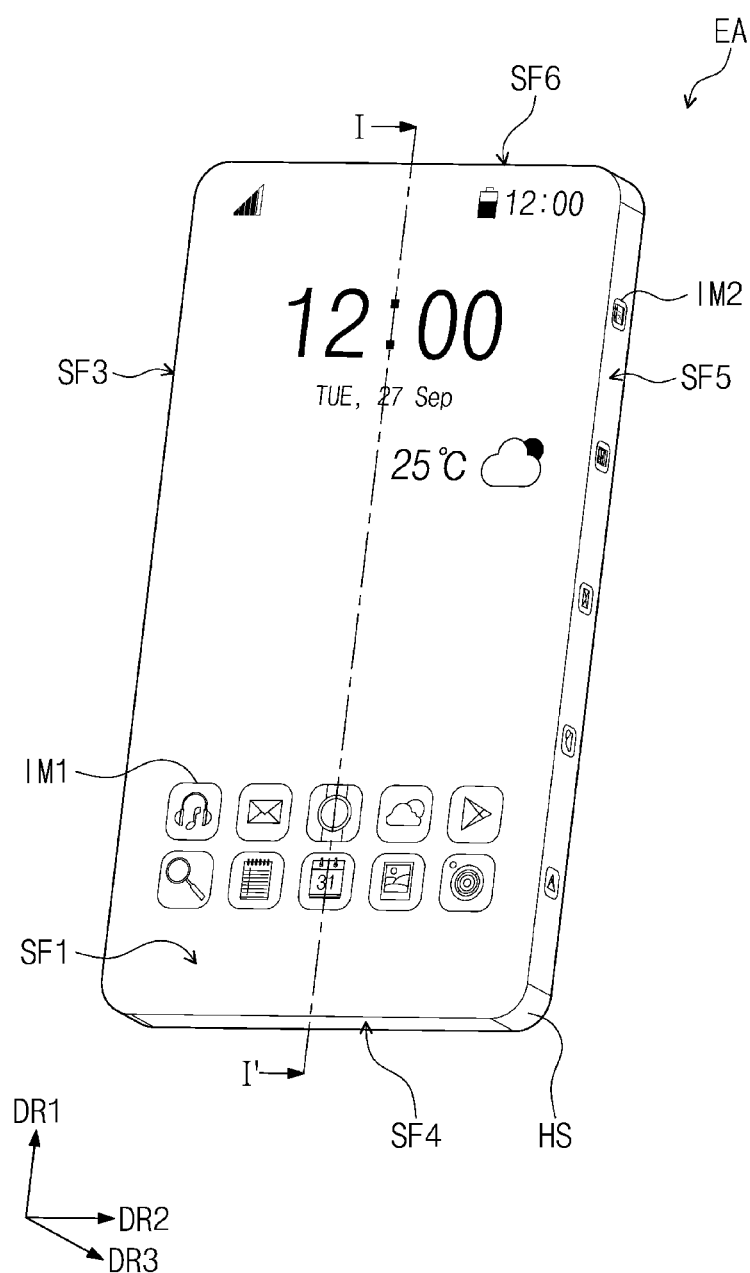
FIG. 1 illustrates a perspective view showing a front surface and its connected portion of a lateral surface of a display device according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In this description, when a certain component (or region, layer, portion, and the like.) is referred to as being "on", "connected to", or "coupled to" other component(s), the certain component may be directly disposed on, directly connected to, or directly coupled to the other component(s) or at least one intervening component may be therebetween.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." The term "and/or" includes one or more combinations defined by associated components.

It will be understood that, although the terms first, second, and the like. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Hereinafter, embodiments of the invention will be described in detail with the accompanying drawings.

FIG. 1 illustrates a perspective view showing a front surface and a connected portion of a lateral surface of a display device according to an exemplary embodiment of the invention.

In an exemplary embodiment, a display device EA may display images IM1 and IM2 on a front surface SF1 and on one or more of first, second, third, and fourth lateral surfaces SF3, SF4, SF5, and SF6 connected to the front surface SF1 in response to electrical signals, and may also detect an external input.

In an exemplary embodiment, as shown in FIG. 1, the display device EA may show the image IM1 displayed on the front surface SF1 and the image IM2 displayed on the third lateral surface SF5.

The external input may include a user's body, light, heat, pressure, or any various type inputs. In an exemplary embodiment, the external input may include a contact touch or a proximity touch. In an exemplary embodiment, as shown in FIG. 1, the display device EA may be a smart phone, for example, but not being limited thereto. Alternatively, the display device EA may be used for diverse products including displays, such as televisions, monitors, tablet computers, game consoles, and smart watches. Herein, the external input may be classified into force and touch.

The front surface SF1 of the display device EA may be parallel to a plane defined by a first direction DR1 and a second direction DR2. In an exemplary embodiment, when viewed in a plan view, the display device EA may have a longer side that extends in the first direction DR1 and a shorter side that extends in the second direction DR2. A third direction DR3 may be defined by a normal direction to the front surface SF1 of the display device EA, or a thickness direction of the display device EA. However, the first, second, and third directions DR1, DR2, and DR3 are relative concepts and may denote other directions.

Figure 2:
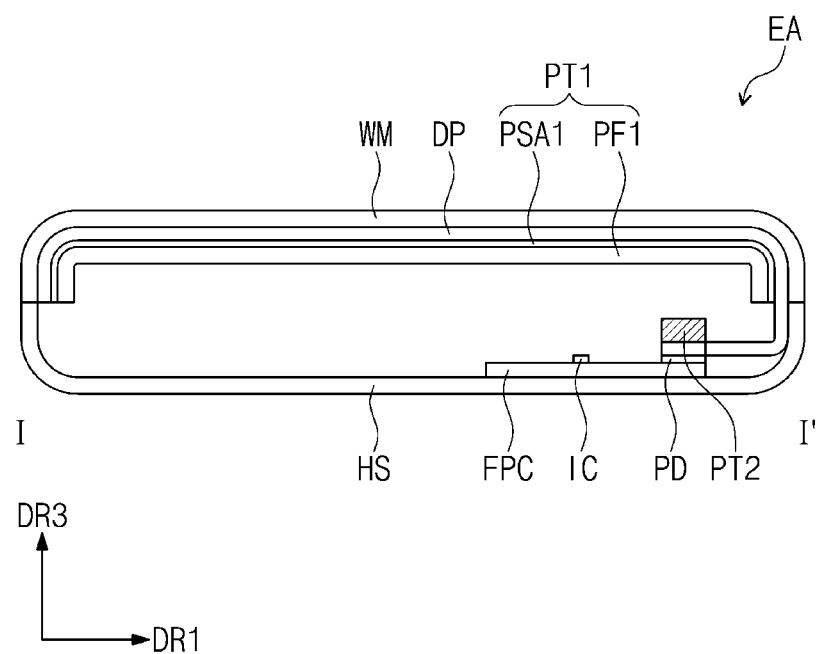
FIG. 2 illustrates a cross-sectional view taken along line I-I' of FIG. 1.

FIG. 2 illustrates a cross-sectional view taken along line I-I' of FIG. 1.

The display device EA may include a display panel DP, a first protective member PT1, a second protective member PT2, a window member WM, a printed circuit board FPC, and a housing HS.

The display panel DP may display an image. The display panel DP may be flexible. In an exemplary embodiment, the display panel DP may be an organic light emitting display panel.

An image may be displayed on the display panel DP that is bent to overlap the front surface SF1 and the first, second, third, and fourth lateral surfaces SF3, SF4, SF5, and SF6 of the display device EA.

The first protective member PT1 and the second protective member PT2 may be attached to a rear surface of the display panel DP. The first protective member PT1 and the second protective member PT2 will be described later in greater detail.

The printed circuit board FPC may be attached to the display panel DP. The printed circuit board FPC may provide external signals to the display panel DP or may externally transfer signals received from the display panel DP. The printed circuit board FPC may include a driver circuit chip IC. However, the invention is not limited thereto, and alternatively, the driver circuit chip IC may be mounted on the display panel DP.

The window member WM may be disposed on the display panel DP. The window member WM may cover the display panel DP and may have a similar shape to that of the display panel DP. The window member WM may constitute one or more of the front surface SF1 and the first, second, third, and fourth lateral surfaces SF3, SF4, SF5, and SF6 of the display device EA.

The housing HS and the window member WM may form an appearance of the display device EA. In an exemplary embodiment, as shown in FIG. 2, the housing HS may constitute a rear surface of the display device EA and regions between the first, second, third, and fourth lateral surfaces SF3, SF4, SF5, and SF6 of the display device EA. However, the invention is not limited thereto. Alternatively, the housing HS may be omitted, and the display panel DP and the window member WM cover an entire outer region of the display device EA.

Figure 3:
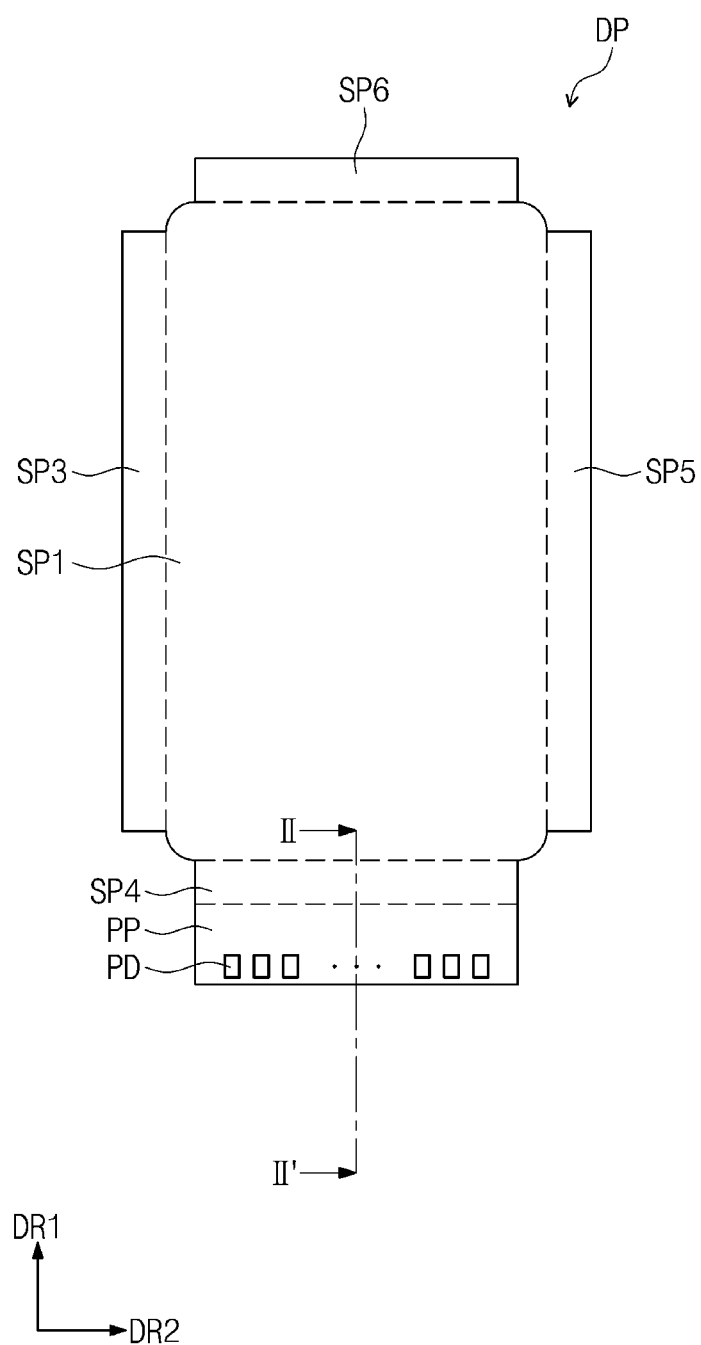
FIG. 3 illustrates a plan view showing a display panel in an unbent state according to an exemplary embodiment of the invention.
Figure 4:
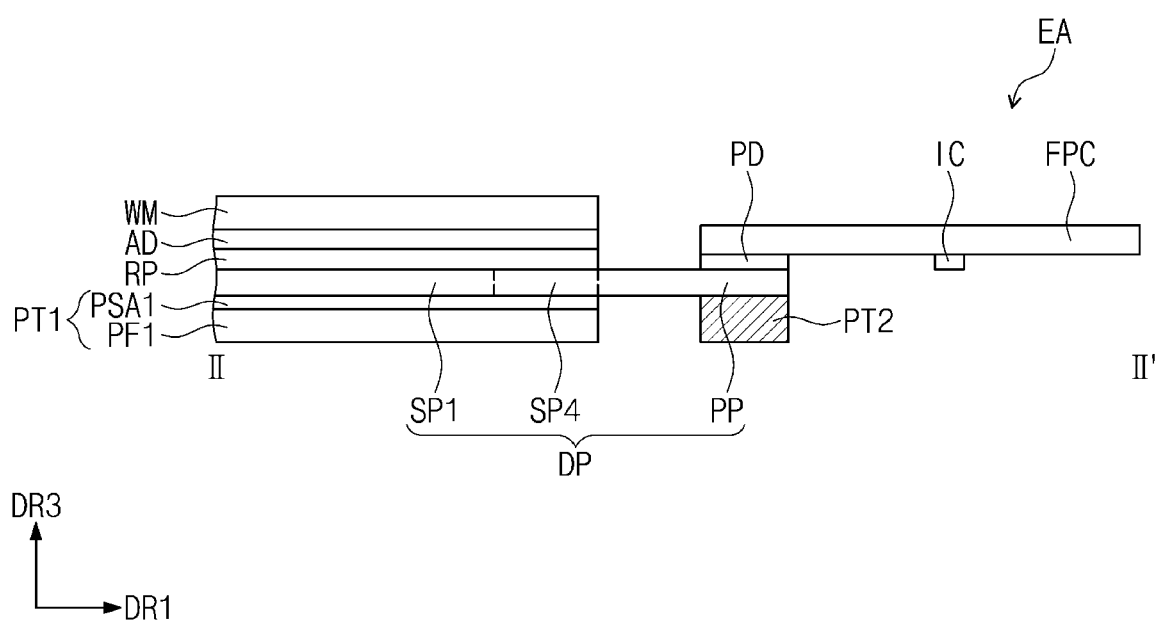
FIG. 4 illustrates a cross-sectional view taken along line II-II' of FIG. 3, showing a display panel and components connected thereto.

FIG. 3 illustrates a plan view showing a display panel in an unbent state according to an exemplary embodiment of the invention. FIG. 4 illustrates a cross-sectional view taken along line II-II' of FIG. 3, showing a display panel and components connected thereto.

Referring to FIGS. 2 to 4, an exemplary embodiment of the display panel DP may include a front part SP1, a pad portion PP, and first, second, third, and fourth side parts SP3, SP4, SP5, and SP6.

In such an embodiment, an image may be displayed on the front part SP1 and each of the first, second, third, and fourth side parts SP3, SP4, SP5, and SP6. Therefore, the display panel DP may display an image on at least five surfaces.

The front part SP1 may have a rectangular shape with rounded edges.

The first side part SP3 may extend from a first boundary line or a first side of the front part SP1. The second side part SP4 may extend from a second boundary line or a second side of the front part SP1. The third side part SP5 may extend from a third boundary line opposite to the first boundary line of the front part SP1, and may face the first side part SP3. The fourth side part SP6 may extend from a fourth boundary line opposite to the second boundary line of the front part SP1, and may face the second side part SP4. The first, second, third, and fourth side parts SP3, SP4, SP5, and SP6 may be spaced apart from each other.

The pad portion PP may extend from the second side part SP4. The pad portion PP may not display an image. However, the invention is not limited thereto, and alternatively, the pad portion PP may display an image on a region thereof adjacent to the second side part SP4.

The display panel DP may be bent around four boundary lines of the front part SP1. The display panel DP may have a curvature near a boundary between the front part SP1 and the first, second, third, and fourth side parts SP3, SP4, SP5, and SP6.

The display panel DP may be further bent about a boundary between the pad portion PP and the second side part SP4. On the display panel DP in a bent state, the front part SP1 and the pad portion PP may be spaced apart in the third direction DR3 from each other, while facing each other.

The pad portion PP may include pads PD. The pads PD may be spaced apart from each other in the second direction DR2. The pads PD may be connected to and may exchange signals with the printed circuit board FPC.

In an exemplary embodiment, as shown in FIG. 4, the display device EA may further include an antireflection layer RP and an adhesive layer AD that are disposed between the window member WM and the display panel DP.

The antireflection layer RP may prevent external light from being reflected from an inside of the display panel DP, such that the inside of the display panel DP is not visible to a user. In an exemplary embodiment, the antireflection layer RP may include an optical film stack such as a polarizing film and a $\lambda/4$ wavelength film for preventing reflection of external light. In an alternative exemplary embodiment, the antireflection layer RP may include a color filter and a black matrix.

The adhesive layer AD may be disposed between the antireflection layer RP and the window member WM and may couple the antireflection layer RP and the window member WM to each other. The adhesive layer AD may include an optical clear adhesive ("OCA") or an optical clear resin ("OCR").

The first protective member PT1 may be disposed below the display panel DP. The first protective member PT1 may be attached to a bottom surface of a base layer (see SUB of FIG. 5) that constitutes the rear surface of the display panel DP.

The first protective member PT1 may overlap the front part SP1 and the first, second, third, and fourth side parts SP3, SP4, SP5, and SP6 of the display panel DP. The first protective member PT1 may not overlap the pads PD.

The second protective member PT2 may be disposed in a same layer as the first protective member PT1. The second protective member PT2 may overlap the pad portion PP. The second protective member PT2 may have a different material from that of the first protective member PT1. The second protective member PT2 may be spaced apart from the first protective member PT1.

The first protective member PT1 may include a first adhesive layer PSA1 and a first protective film PF1. The first protective member PT1 may serve to absorb impact applied to a lower portion of the display panel DP.

The first protective film PF1 may include at least one polymeric material, for example, one or more of polyimide, polyethylene terephthalate ("PET"), polycarbonate, polyethylene naphtalate, polyarylate ("PAR"), and polyetherimide.

The first adhesive layer PSA1 may be disposed between the display panel DP and the first protective film PF1 and may couple the display panel DP and the first protective film PF1 to each other.

In an exemplary embodiment, the display panel DP may be bent about the bounding lines of the front part SP1, and the first protective member PT1 may overlap not only the front part SP1 but also the first, second, third, and fourth side parts SP3, SP4, SP5, and SP6. In such an embodiment, the first protective film PF1 may reduce stress caused when the display panel DP is bent. In an exemplary embodiment, the first adhesive layer PSA1 may have a modulus in a range from about 20 kilopascal (kPa) to about 45 kPa. Thus, in such an embodiment, the first protective film PF1 including the first adhesive layer PSA1 may reduce stress resulting from the bending of the display panel DP.

The second protective member PT2 may have bending stiffness greater than that of the first protective member PT1. Therefore, compared to the first protective member PT1, the second protective member PT2 may have small deformation caused by external impact applied in the third direction DR3.

The second protective member PT2 may have a single layer structure, and may be attached directly to the bottom surface of the base layer (see SUB of FIG. 5) that constitutes the rear surface of the display panel DP. The second protective member PT2 may have a modulus greater than that of the first adhesive layer PSA1.

The second protective member PT2 may include a pressure sensitive adhesive ("PSA"). The PSA may include an oligomer, a monomer, a photopolymerization initiator, and an additive. The PSA may have a radical polymerization type or a cationic polymerization type. The oligomer of the radical polymerization type PSA may include one of polyester acrylate, epoxy acrylate, urethane acrylate, polyether acrylate, and silicone acrylate. The monomer of the radical polymerization type PSA may include a mono-functional monomer or a multi-functional monomer. The photopolymerization initiator of the radical polymerization type PSA may include either benzoin ethers or amines. The additive of the radical polymerization type PSA may include a tackifier, a filler, or a polymerization inhibitor. The oligomer of the cationic polymerization type PSA may include alicyclic epoxy resin, glycidyl ether resin, epoxy acrylate, or vinyl ether. The monomer of the cationic polymerization type PSA may include epoxy monomers, vinyl ethers, or cyclic ethers. The photopolymerization initiator of the cationic polymerization type PSA may include a diazonium salt, an iodonium salt, a sulfonium salt, or a metallocene compound. The additive of the cationic polymerization type PSA may include a silane coupling agent.

In an exemplary embodiment, a compression process may be performed to bond the pad PD of the pad portion PP to the printed circuit board FPC. Provided that the first protective member PT1 including the relatively low-modulus first adhesive layer PSA1 below the display panel DP has a structure that extends to the pad portion PP, the first adhesive layer PSA1 may be deformed due to pressure when a bonding process is performed on the printed circuit board FPC and the pad PD, and bonding defects may then occur due to reduced pressure applied between the printed circuit board FPC and the pad PD.

According to an exemplary embodiment of the invention, the front part SP1 and the first, second, third, and fourth side parts SP3, SP4, SP5, and SP6 may overlap the first protective member PT1 that includes the first adhesive layer PSA1 having a relatively low modulus, and thus it may be possible to reduce bending-induced stress. In such an embodiment, because the pad portion PP overlaps the second protective member PT2 having a relatively great bending stiffness, a compression process may be effectively performed on the printed circuit board FPC and the pad PD.

Figure 5:
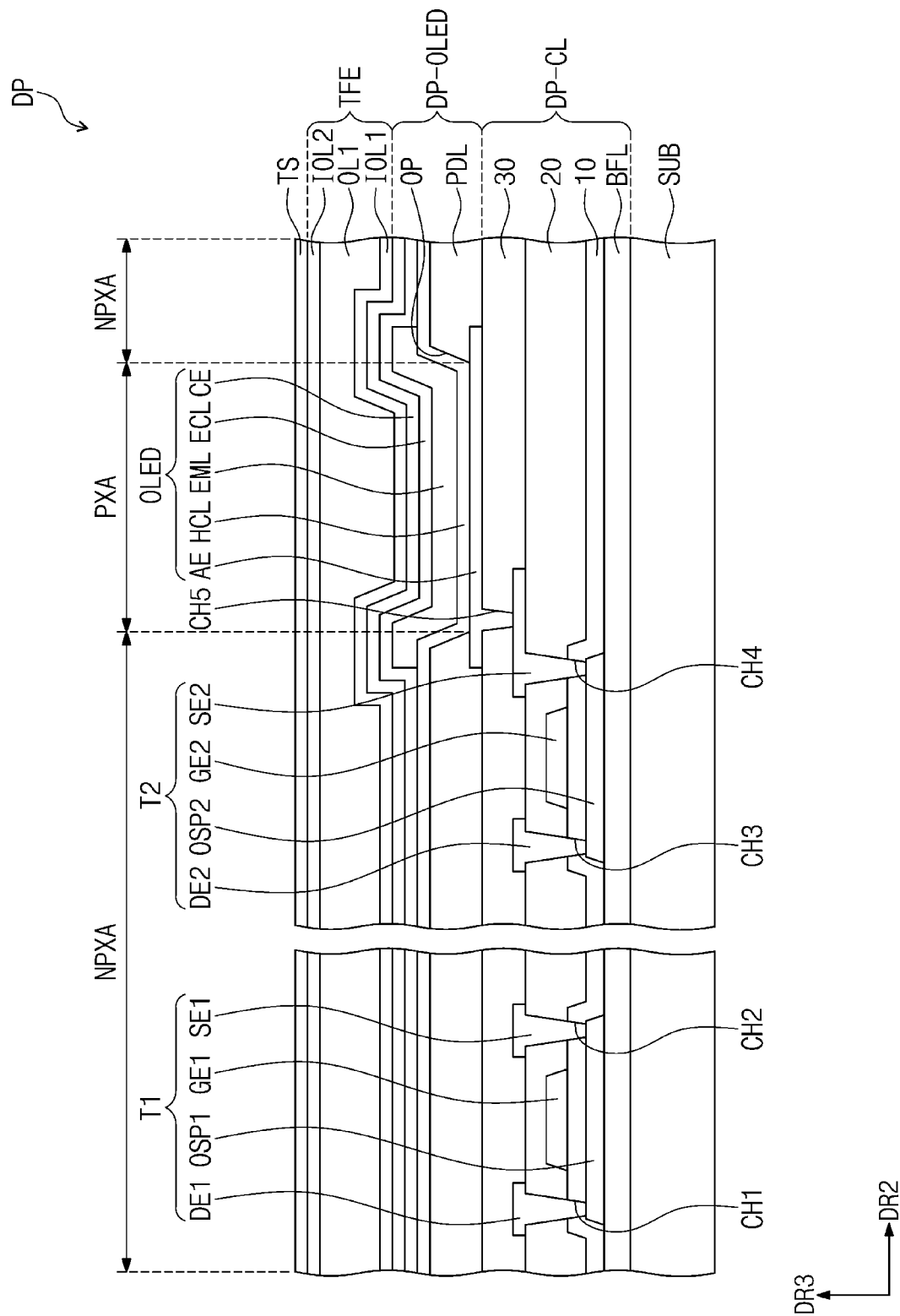
FIG. 5 illustrates a cross-sectional view showing a portion of an exemplary embodiment of a display panel.

FIG. 5 illustrates a cross-sectional view showing a portion of an exemplary embodiment of the display panel DP.

An exemplary embodiment of the display panel DP may include a base substrate SUB, a circuit element layer DP-CL, a display element layer DP-OLED, and an encapsulation layer TFE.

The circuit element layer DP-CL includes transistors. In an exemplary embodiment, as shown in FIG. 5, the circuit element layer DP-CL includes may include a first transistor T1 and a second transistor T2 for driving a single organic light emitting diode OLED.

The circuit element layer DP-CL includes at least one inorganic layer, at least one organic layer, and a circuit element. In an exemplary embodiment, as shown in FIG. 5, the circuit element layer DP-CL may include an inorganic buffer layer BFL, a first intermediate inorganic layer 10, a second intermediate inorganic layer 20, and an intermediate organic layer 30.

The inorganic layers may include silicon nitride, silicon oxynitride, silicon oxide, and the like. The organic layer may include one or more of acryl-based resin, methacryl-based resin, vinyl-based resin, epoxy-based resin, urethane-based resin, cellulose-based resin, siloxane-based resin, polyimide-based resin, polyamide-based resin, and perylene-based resin. The circuit element may include conductive patterns and/or semiconductor patterns.

The buffer layer BFL increases adhesive forces between the base layer SUB and either the conductive patterns or the semiconductor patterns. Although not shown, a barrier layer may be further provided on a top surface of the base layer SUB to prevent introduction of foreign substances. The buffer layer BFL and the barrier layer may be optionally disposed or omitted.

The buffer layer BFL is disposed thereon with a semiconductor pattern OSP1 (also referred to as a first semiconductor pattern) of the first transistor T1 and a semiconductor pattern OSP2 (also referred to as a second semiconductor pattern) of the second transistor T2. The first semiconductor pattern OSP1 and the second semiconductor pattern OSP2 may include at least one material selected from amorphous silicon, polysilicon, and metal oxide semiconductor.

The first intermediate inorganic layer 10 is disposed on the first semiconductor pattern OSP1 and the second semiconductor pattern OSP2. In such an embodiment, a control electrode GE1 (also referred to as a first control electrode) of the first transistor T1 and a control electrode GE2 (also referred to as a second control electrode) of the second transistor T2 may be disposed on the first intermediate inorganic layer 10. The first control electrode GE1 and the second control electrode GE2 may be fabricated by a same photolithography process as that used for manufacturing scanning lines.

In an exemplary embodiment, the second intermediate inorganic layer 20 that covers the first control electrode GE1 and the second control electrode GE2 is disposed on the first intermediate inorganic layer 10. An input electrode DE1 (also referred to as a first input electrode) and an output electrode SE1 (also referred to as a first output electrode) of the first transistor T1 are disposed on the second intermediate inorganic layer 20, and an input electrode DE2 (also referred to as a second input electrode) and an output electrode SE2 (also referred to as a second output electrode) of the second transistor T2 are disposed on the second intermediate inorganic layer 20.

The first input electrode DE1 and the first output electrode SE1 are connected to the first semiconductor pattern OSP1 through a first through hole CH1 and a second through hole CH2, respectively, each of which is defined or formed through the first intermediate inorganic layer 10 and the second intermediate inorganic layer 20. The second input electrode DE2 and the second output electrode SE2 are connected to the second semiconductor pattern OSP2 through a third through hole CH3 and a fourth through hole CH4, respectively, each of which is defined or formed through the first intermediate inorganic layer 10 and the second intermediate inorganic layer 20. In an alternative exemplary embodiment, one or more of the first transistor T1 and the second transistor T2 may have a bottom gate structure.

The second intermediate inorganic layer 20 is disposed thereon with an intermediate organic layer 30 that covers the first input electrode DE1, the second input electrode DE2, the first output electrode SE1, and the second output electrode SE2. The intermediate organic layer 30 may provide a planarized surface.

The display element layer DP-OLED is disposed on the intermediate organic layer 30. The display element layer DP-OLED may include a pixel definition layer PDL and an organic light emitting diode OLED. The pixel definition layer PDL may include an organic material substantially the same that of the intermediate organic layer 30. A first electrode AE is disposed on the intermediate organic layer 30. The first electrode AE is connected to the second output electrode SE2 through a fifth through hole CH5 defined or formed through the intermediate organic layer 30. An opening OP is defined in the pixel definition layer PDL. The opening OP of the pixel definition layer PDL exposes at least a portion of the first electrode AE.

A light emitting area PXA and a non-light emitting area NPXA may be defined on the display panel DP. The non-light emitting area NPXA may surround the light emitting area PXA. In an exemplary embodiment, the light emitting area PXA is defined to correspond to a portion of the first electrode AE, which portion is exposed to the opening OP. The light emitting area PXA is a region that emits light output from the organic light emitting diode OLED, and the non-light emitting area NPXA is a region that blocks light output from the organic light emitting diode OLED. Although not shown, the non-light emitting area NPXA may be defined between a plurality of light emitting areas PXA. In an exemplary embodiment, the non-light emitting area NPXA is a single connected region. However, for convenience of description, the non-light emitting area NPXA may be divided into a plurality of region to specify a certain region of the non-light emitting area NPXA.

A hole control layer HCL may be disposed in common on the light emitting area PXA and the non-light emitting area NPXA. Although not shown, a common layer such as the hole control layer HCL may be disposed or formed on or to cover an entire surface of the base layer SUB.

An emission layer EML is disposed on the hole control layer HCL. The emission layer EML may be disposed on a region that corresponds to the opening OP. In one exemplary embodiment, for example, the emission layer EML may be formed into a plurality of separated pieces that are disposed on a plurality of light emitting areas PXA, respectively. The emission layer EML may include an organic material and/or an inorganic material. In an exemplary embodiment, the emission layer EML may be a patterned layer as described above, but not being limited thereto. Alternatively, the emission layer EML may be disposed in common on a plurality of light emitting areas PXA. In such an embodiment, the emission layer EML may produce red, green, blue, or white light, and is not limited to colors of light generated therefrom. In an exemplary embodiment, the emission layer EML may have a multi-layered structure.

An electron control layer ECL is disposed on the emission layer EML. Although not shown, the electron control layer ECL may be disposed or formed in common on a plurality of light emitting areas PXA.

A second electrode CE is disposed on the electron control layer ECL. The second electrode CE is disposed in common on a plurality of light emitting areas PXA.

An encapsulation layer TFE is disposed on the second electrode CE. The encapsulation layer TFE is disposed in common on a plurality of light emitting areas PXA. In an exemplary embodiment, the encapsulation layer TFE directly covers the second electrode CE.

The encapsulation layer TFE may include at least one encapsulation inorganic layer and at least one encapsulation organic layer. The encapsulation inorganic layer and the encapsulation organic layer may be alternately stacked one on another.

In an exemplary embodiment, the encapsulation layer TFE may include first and second encapsulation inorganic layers IOL1 and IOL2. Alternatively, the encapsulation layer TFE may include only a first encapsulation organic layer OL1.

The first encapsulation inorganic layer IOL1, the first encapsulation organic layer OL1, and the second encapsulation inorganic layer IOL2 may be sequentially stacked on the second electrode CE.

The first encapsulation organic layer OL1 may be formed by using an inkjet printing process, or by coating a composition material including an acryl-based monomer. The first and second encapsulation inorganic layers IOL1 and IOL2 may include a same inorganic material as each other or different inorganic materials from each other. A material constituting the first and second encapsulation inorganic layers IOL1 and IOL2 may include, but not particularly limited to, silicon nitride, silicon oxynitride, silicon oxide, or the like.

In an exemplary embodiment, the encapsulation layer TFE and the second electrode CE may further be disposed therebetween with a capping layer that covers the second electrode CE. In such an embodiment, the encapsulation layer TFE may directly cover the capping layer.

The display panel DP may further include a touch sensing unit TS.

The touch sensing unit TS acquires coordinate information of an external input. The touch sensing unit TS may be directly disposed on the encapsulation layer TFE. Herein, the phrase "directly disposed" excludes the meaning that an adhesive layer is used for attachment, and includes the meaning of "formed by a continuous process." However, the invention is not limited thereto, and the touch sensing unit TS may be attached through an adhesive layer to the encapsulation layer TFE.

Figure 6:
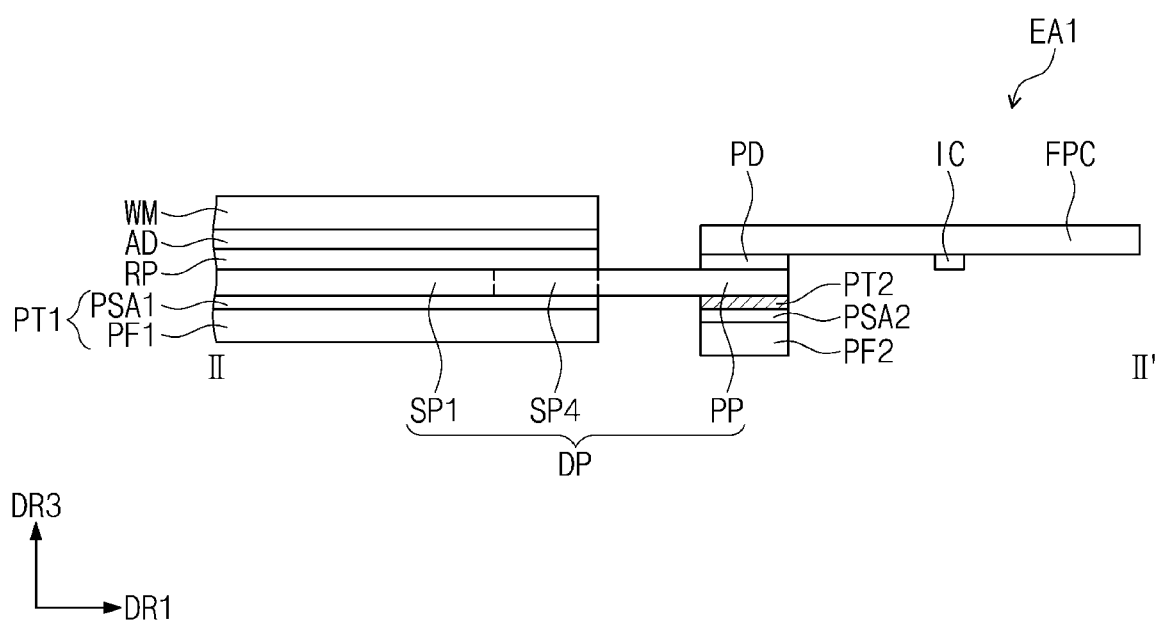
FIG. 6 illustrates a cross-sectional view showing a display panel and some components of a display device according to an exemplary embodiment of the invention.

FIG. 6 illustrates a cross-sectional view showing a display panel and some components of a display device according to an exemplary embodiment of the invention. In FIG. 6, a portion of a display panel is shown to correspond to a cross-sectional view taken along line II-II' of FIG. 3.

Referring to FIG. 6, an exemplary embodiment of a display device EA1 may further include a second protective film PF2 and a second adhesive layer PSA2.

The second protective film PF2 and the second adhesive layer PSA2 may be disposed to overlap the second protective member PT2, but may not overlap the first protective member PT1. The second adhesive layer PSA2 may be disposed between the second protective member PT2 and the second protective film PF2 and may couple the second protective member PT2 and the second protective film PF2 to each other.

In an exemplary embodiment, the second adhesive layer PSA2 may include a material substantially the same as that of the first adhesive layer PSA1. However, the invention is not limited thereto, and alternatively, the second adhesive layer PSA2 may include a different material from that of the first adhesive layer PSA1.

In an exemplary embodiment, the second protective film PF2 may include a material substantially the same as that of the first protective film PF1. However, the invention is not limited thereto, and alternatively, the second protective film PF2 may include a different material from that of the first protective film PF1.

Figure 7:
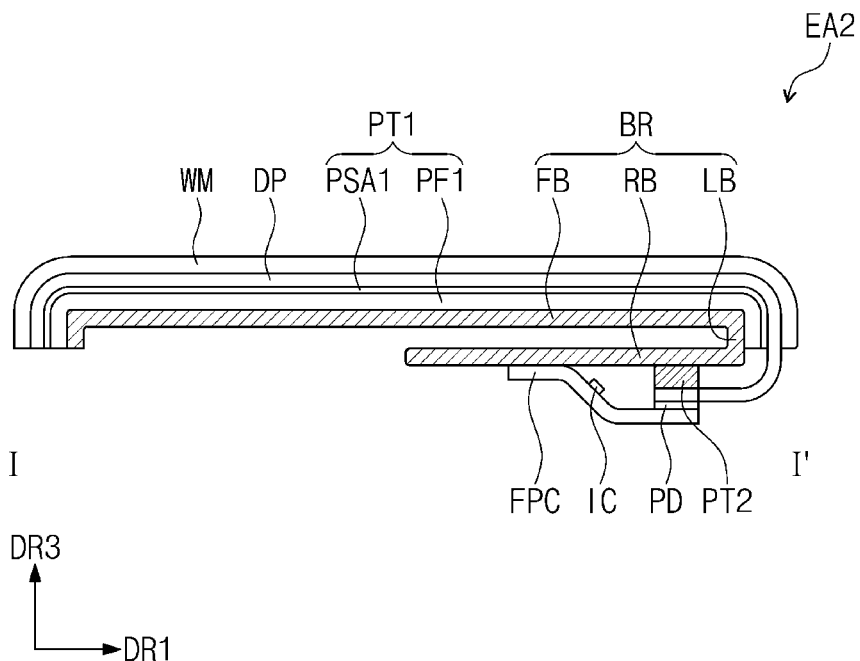
FIG. 7 illustrates a cross-sectional view taken along line I-I' of FIG. 1, showing a display device according to an alternative exemplary embodiment of the invention.

FIG. 7 illustrates a cross-sectional view taken along line I-I' of FIG. 1, showing a display device according to an alternative exemplary embodiment of the invention.

In an exemplary embodiment, as shown in FIG. 7, a display device EA2 may be substantially the same as the display device EA described above with reference to FIG. 2, except that the display device EA2 may further include a bracket BR.

The bracket BR may be disposed below the display panel DP and may support the display panel DP. The bracket BR may include a material having a stiffness greater than that of the display panel DP. In an exemplary embodiment, as shown in FIG. 7, a single bracket BR supports an entire region of the display panel DP, but not being limited thereto. Alternatively, a plurality of brackets BR may be provided. The bracket BR may support a portion of the display panel DP.

The bracket BR may be divided into a front bracket FB, a lateral bracket LB, and a rear bracket RB. The front bracket FB, the lateral bracket LB, and the rear bracket RB may be integrally formed as a single unitary body.

The front bracket FB may support the front part (see SP1 of FIG. 3) of the display panel DP, the lateral bracket LB may support the first, second, third, and fourth side parts (see SP3, SP4, SP5, and SP6 of FIG. 3) of the display panel DP, and the rear bracket RB may support the pad portion (see PP of FIG. 3) of the display panel DP. The rear bracket RB and the front bracket FB may face each other in the third direction DR3.

The rear bracket RB may further support the printed circuit board FPC.

The front bracket FB, the lateral bracket LB, and the rear bracket RB may provide or define an inner space of the bracket BR. The inner space of the bracket BR may accommodate electronic components, such as a battery, a main printed circuit board or any type of sensors, which may be included or used for operation of the display device EA2.

In an exemplary embodiment, although not shown, other members, for example, one or more of a heat radiation layer and a cushion layer, may be disposed between the bracket BR and the first protective member PT1.

In an exemplary embodiment, the bracket BR and the housing HS may be spaced apart from each other. Alternatively, the bracket BR and the housing HS may be connected to each other or may be integrally formed as a single unitary body.

Figure 8:
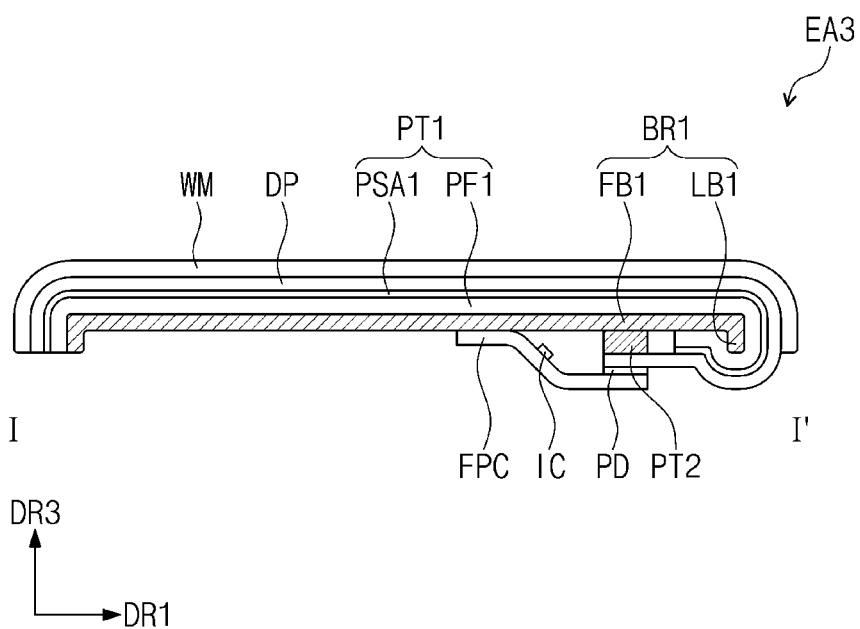
FIG. 8 illustrates a cross-sectional view taken along line I-I' of FIG. 1, showing a display device according to another alternative exemplary embodiment of the invention.

FIG. 8 illustrates a cross-sectional view taken along line I-I' of FIG. 1, showing a display device according to another alternative exemplary embodiment of the invention.

The display device EA3 of FIG. 8 is substantially the same as the display device EA2 of FIG. 7 except for the bracket BR1.

In such an embodiment, the bracket BR1 may be divided into a front bracket FB1 and a lateral bracket LB1. In one exemplary embodiment, for example, the bracket BR1 of FIG. 8 may have a structure without the rear bracket RB of the bracket BR shown in FIG. 7.

The front bracket FB1 may support the front part (see SP1 of FIG. 3) of the display panel DP, and the lateral bracket LB1 may support the first, second, third, and fourth side parts (see SP3, SP4, SP5, and SP6 of FIG. 3) of the display panel DP. In such an embodiment, the front bracket FB1 and the lateral bracket LB1 may support the pad portion (see PP of FIG. 3) of the display panel DP. The pad portion PP may be bent along the lateral bracket LB1 and the front bracket FB1.

The printed circuit board FPC may further support the front bracket FB1.

In an exemplary embodiment, although not shown, other members, for example, one or more of a heat radiation layer and a cushion layer, may be disposed between the bracket BR1 and the first protective member PT1.

Figure 9A:
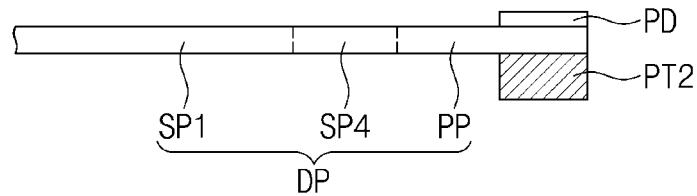
FIGS. 9A to 9C illustrate cross-sectional views showing a method of fabricating a display device according to an exemplary embodiment of the invention.
Figure 9B:
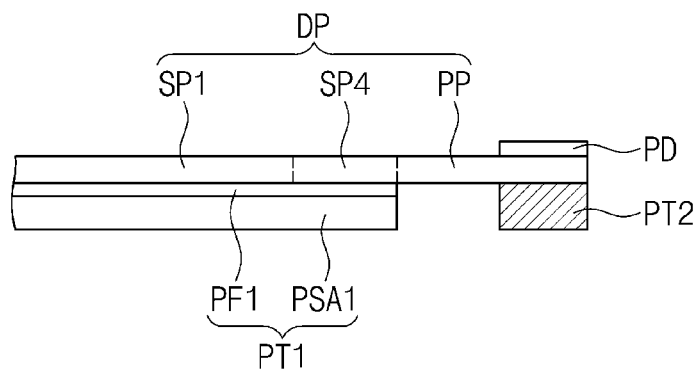
Figure 9C:
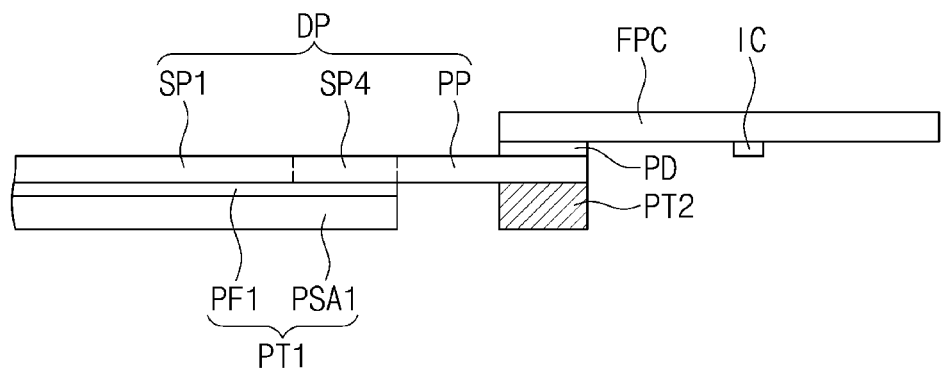

FIGS. 9A to 9C illustrate cross-sectional views showing a method of fabricating a display device according to an exemplary embodiment of the invention.

For convenience of description, referring to FIGS. 9A to 9C, procedures for providing or forming, on the display panel DP, the first protective member PT1 and the second protective member PT2, which are described above with reference to FIGS. 2 to 4.

In an exemplary embodiment, a display panel DP is formed or prepared. The display panel DP may correspond to those described above with reference to a cross-sectional view taken along line II-II' of FIG. 3.

Referring to FIG. 9A, a second protective member PT2 is provided or formed on a pad portion PP of the display panel DP including a pad PD.

The second protective member PT2 may be formed by directly coating a curable material on one surface of the pad portion PP and then curing the curable material. The curable material may include a thermo-curable material, a photo-curable material or a natural curable material, for example.

However, the invention is not limited thereto, and in an alternative exemplary embodiment, a deposition process may be performed to form the second protective member PT2. In one exemplary embodiment, for example, a deposition material may be deposited on one surface of the display panel DP, and then a patterning process using an etching mask may be performed to form the second protective member PT2 that overlaps the pad portion PP.

Referring to FIG. 9B, a first protective member PT1 may be provided or formed on a front part SP1 and a side part SP4 of the display panel DP. The formation of the first protective member PT1 may include providing or forming a first adhesive layer PSA1 on the front part SP1 and the side part SP4, and then providing or forming a first protective film PF1 on the first adhesive layer PSA1.

Afterwards, referring to FIG. 9C, the pad PD and a printed circuit board FPC may be compressed to bond to each other.

Thereafter, as shown in FIG. 4, an antireflection layer RP may be provided or formed on the display panel DP, and then a window member WM may be attached onto the antireflection layer RP using an adhesive layer AD.

Figure 10A:
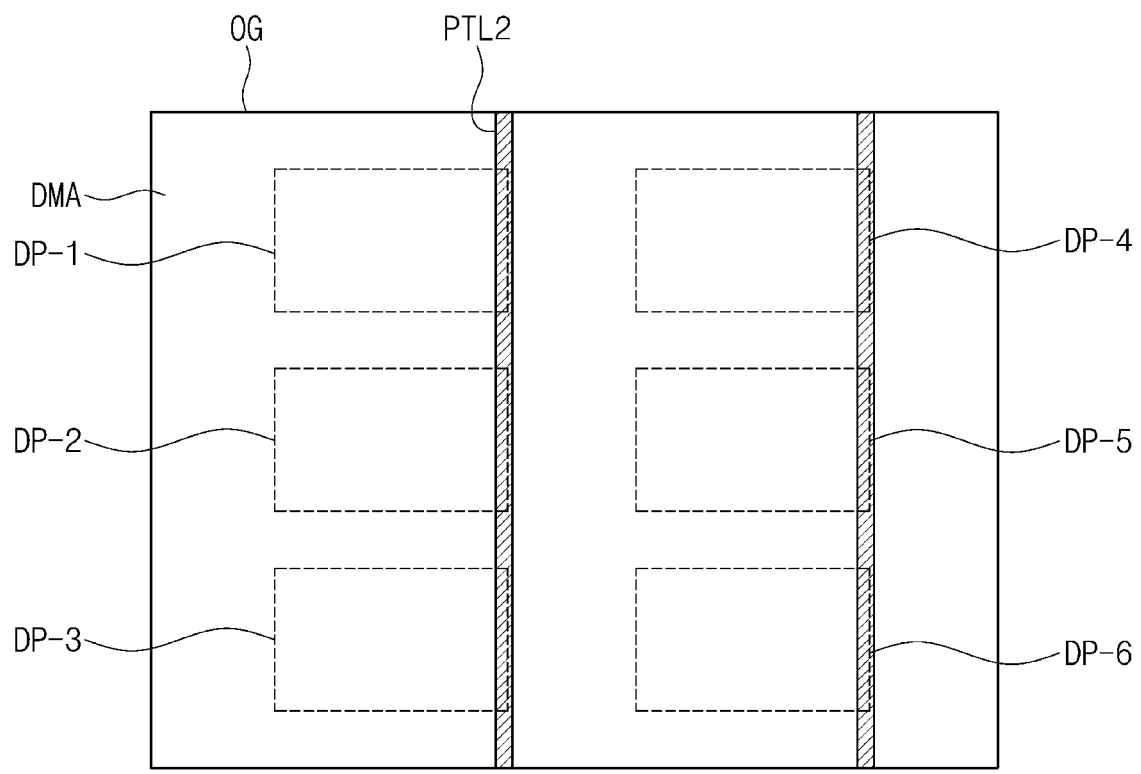
FIGS. 10A and 10B illustrate plan views showing a method of fabricating a display device according to an exemplary embodiment of the invention.
Figure 10B:
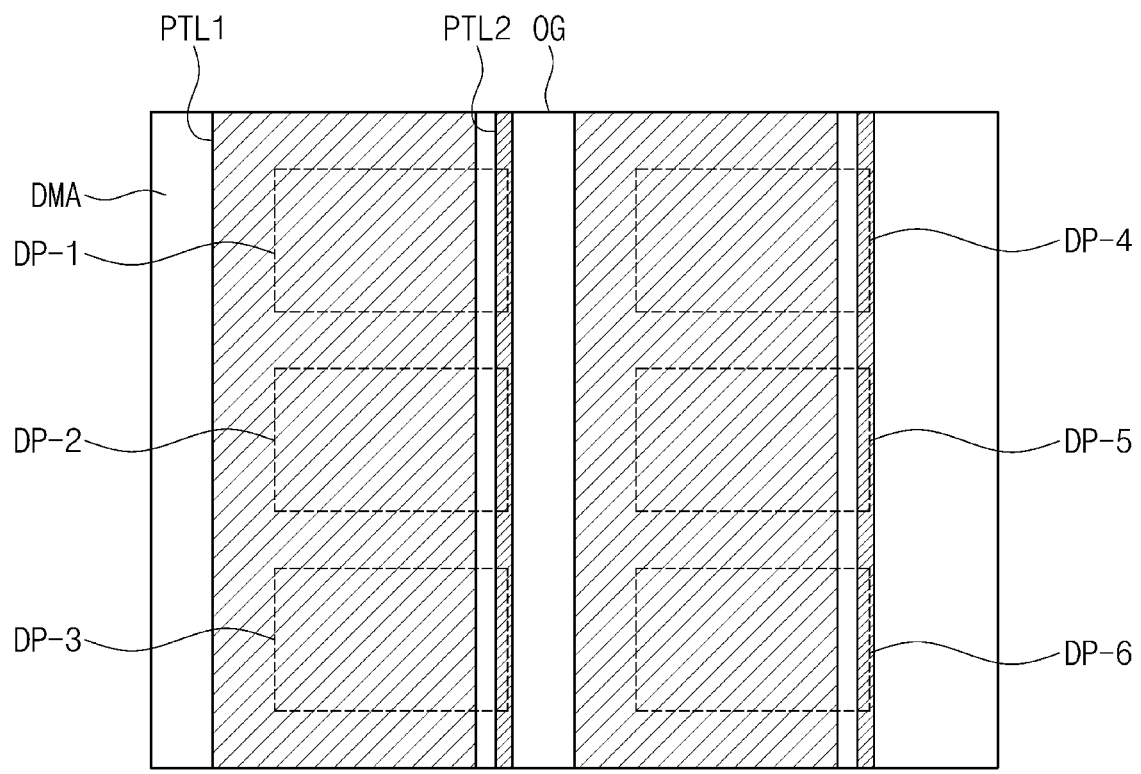

FIGS. 10A and 10B illustrate plan views showing a method of fabricating a display device according to an exemplary embodiment of the invention.

Referring to FIG. 10A, a mother substrate OG is formed or prepared. The mother substrate OG may include a plurality of display panels DP-1 to DP-6 and a dummy area DMA. The dummy area DMA may be provided between the display panels DP-1 to DP-6, and the dummy area DMA and the display panels DP-1 to DP-6 may be formed as a single body. In such an embodiment, the display panels DP-1 to DP-6 are cut from the mother substrate OG to form a display panel DP described above with reference to FIGS. 2 to 4.

Each of the display panels DP-1 to DP-6 of the mother substrate OG may include a front part, a side part, and a pad portion.

On one surface of the mother substrate OG, a second protective member layer PTL2 is formed to overlap the pad portion of each of the display panels DP-1 to DP-6. The second protective member layer PTL2 may include a material substantially the same as that of the second protective member PT2 described above with reference to FIGS. 2 to 4.

After that, referring to FIG. 10B, a first protective member layer PTL1 is formed on the one surface of the mother substrate OG having the second protective member layer PTL2 formed on the surface thereof, and thus the first protective member layer PTL1 overlaps the front part and the side part of each of the display panels DP-1 to DP-6. The first protective member layer PTL1 may include a material substantially the same as that of the first protective member PT1 described above with reference to FIGS. 1 to 4.

Thereafter, the mother substrate OG is cut along boundaries between the display panels DP-1 to DP-6 such that a display device having a structure, in which the first protective member PT1 and the second protective member PT2 are attached to the display panel DP as described above with reference to FIG. 9B, is formed.

According to embodiments of a display device and a method of fabricating the display device in accordance with the invention, it may be possible to reduce stress caused when a display panel is bent.

In such embodiments, it may also be possible to prevent bonding defects between a printed circuit board and a pad of the display panel.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, comprising:
    a display panel including a front part, a first side part extending from the front part, and a pad portion extending from the first side part, wherein a pad is on the pad portion, the first side part is bent, and each of the front part and the first side part displays an image;
    a first protective member attached to a bottom surface of a base substrate of the display panel and overlapping the front part and the first side part; and
    a second protective member attached to the bottom surface of the base substrate of the display panel, wherein the second protective member overlaps the pad portion, and the second protective member is disposed between the pad portion and the first protective film,
    wherein the first protective member includes:
        a first protective film; and
        a first adhesive layer between the display panel and the first protective film.

2. The display device of claim 1, wherein the first protective member and the second protective member are spaced apart from each other.

3. The display device of claim 1, wherein the first protective member and the second protective member include different materials from each other.

4. The display device of claim 1, wherein the second protective member is disposed in a same layer as the first protective member.

5. The display device of claim 1, wherein the second protective member includes a radical polymerization type pressure sensitive adhesive or a cationic polymerization type pressure sensitive adhesive, and
    wherein the radical polymerization type pressure sensitive adhesive or the cationic polymerization type pressure sensitive adhesive includes an oligomer, a monomer, a photopolymerization initiator, and an additive.

6. The display device of claim 1, wherein the first protective member does not overlap the pad.

7. The display device of claim 1, wherein the second protective member has a bending stiffness greater than a bending stiffness of the first protective member.

8. The display device of claim 1, wherein the first adhesive layer has a modulus in a range from about 20 kPa to about 45 kPa.

9. The display device of claim 7, further comprising:
    a second protective film on the second protective member; and
    a second adhesive layer between the second protective member and the second protective film.

10. The display device of claim 9, wherein
    the second protective film includes a material substantially the same as a material of the first protective film, and
    the second adhesive layer includes a material substantially the same as a material of the first adhesive layer.

11. The display device of claim 1, wherein
    the front part is in a substantially rectangular shape when viewed in a plan view,
    the first side part extends from a first side of the front part, and
    the display panel further includes second, third and fourth side parts, which respectively extend from second, third and fourth sides of the front part, wherein the first to fourth parts are bent.

12. The display device of claim 1, further comprising:
    a flexible printed circuit board attached to the pad.

13. The display device of claim 1, further comprising:
    a bracket which is below the display panel and supports the display panel.

14. The display device of claim 1, further comprising:
    a window member on the display panel and covering the front part and the first side part.

15. A display device, comprising:
a display panel including a front part, a first side part extending from the front part, and a pad portion extending from the first side part, wherein the display panel includes a base substrate divided into a portion corresponding to the front part, a portion corresponding to the first side part and a portion corresponding to the pad portion, a pad is on the pad portion, the first side part is bent, and each of the front part and the first side part displays an image;
a first adhesive layer attached to a bottom surface of the portion of the base substrate corresponding to the front part and attached to a bottom surface of the portion of the base substrate corresponding to the first side part;
a first protective film attached to the first adhesive layer; and
a second protective member attached to a bottom surface of the portion of the base substrate corresponding to the pad portion, wherein the second protective member is disposed between the pad portion and the first protective film,
wherein the second protective member has a modulus greater than a modulus of the first adhesive layer.

16. The display device of claim 15, wherein the first adhesive layer and the first protective film do not overlap the pad.

17. The display device of claim 15, wherein the first adhesive layer has a modulus in a range from about 20 kPa to about 45 kPa.

18. A method of fabricating a display device, the method comprising:
preparing a display panel including a front part, a side part extending from the front part, and a pad portion extending from the side part, wherein the display panel includes a base substrate divided into a portion corresponding to the front part, a portion corresponding to the first side part and a portion corresponding to the pad portion, a pad is provided on the pad portion, and each of the front part and the side part displays an image;
providing a first protective member on the portion of the base substrate corresponding to the front part and the portion of the base substrate corresponding to the side part;
providing, on the surface of the portion of the base substrate corresponding to the pad portion, a second protective member having a bending stiffness greater than a bending stiffness of the first protective member, wherein the second protective member is disposed on a same surface of the base substrate as the first protective member such that the second protective member is disposed between the pad portion and the first protective member in a state where the side part is bent; and
compressively bonding the pad and a printed circuit board to each other.

19. The method of claim 18, wherein the providing the second protective member includes:
coating a curable material on a rear surface of the display panel; and
curing the curable material.

20. The method of claim 18, wherein the providing the second protective member is performed before the providing the first protective member.

* * * * *